United States Patent
Lin et al.

(10) Patent No.: US 10,431,554 B2
(45) Date of Patent: Oct. 1, 2019

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: I-Chia Lin, Kaohsiung (TW); Chieh-Chen Fu, Kaohsiung (TW); Kuo Hsien Liao, Kaohsiung (TW); Cheng-Nan Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/871,805

(22) Filed: Jan. 15, 2018

(65) Prior Publication Data
US 2018/0158783 A1  Jun. 7, 2018

Related U.S. Application Data

(63) Continuation of application No. 14/990,366, filed on Jan. 7, 2016, now Pat. No. 9,871,005.

(51) Int. Cl.
*H01L 23/552* (2006.01)
*H01L 23/00* (2006.01)
*H01L 21/56* (2006.01)

(52) U.S. Cl.
CPC ............ *H01L 23/552* (2013.01); *H01L 24/97* (2013.01); *H01L 21/561* (2013.01);
(Continued)

(58) Field of Classification Search
CPC .......... H01L 2924/3025; H01L 23/552; H05K 9/0075
(Continued)

(56) References Cited

U.S. PATENT DOCUMENTS

| 5,561,265 | A | 10/1996 | Livshits et al. |
| 5,639,989 | A | 6/1997 | Higgins, III |

(Continued)

OTHER PUBLICATIONS

Non-Final Office Action for U.S. Appl. No. 14/990,366, dated Dec. 21, 2016, 13 pages.
(Continued)

*Primary Examiner* — Jonathan Han
(74) *Attorney, Agent, or Firm* — Foley & Lardner LLP; Cliff Z. Liu

(57) ABSTRACT

A semiconductor device package includes: (1) a carrier; (2) an electronic component disposed over a top surface of the carrier; (3) a package body disposed over the top surface of the carrier and covering the electronic component; and (4) a shield layer, including a first magnetically permeable layer disposed over the package body, a first electrically conductive layer disposed over the first magnetically permeable layer, and a second magnetically permeable layer disposed over the first electrically conductive layer. The first electrically conductive layer is interposed between the first magnetically permeable layer and the second magnetically permeable layer. A permeability of the first electrically conductive layer is different from a permeability of the first magnetically permeable layer and a permeability of the second magnetically permeable layer.

19 Claims, 6 Drawing Sheets

(52) U.S. Cl.
CPC ............... *H01L 2224/16227* (2013.01); *H01L 2224/48091* (2013.01); *H01L 2224/48227* (2013.01); *H01L 2224/97* (2013.01); *H01L 2924/19041* (2013.01); *H01L 2924/19042* (2013.01); *H01L 2924/19043* (2013.01); *H01L 2924/19105* (2013.01)

(58) Field of Classification Search
USPC .......... 257/E23.114, 659, E21.499, E21.502, 257/E23.001, 422; 361/818, 800
See application file for complete search history.

(56) References Cited

U.S. PATENT DOCUMENTS

| | | | |
|---|---|---|---|
| 8,062,930 B1 * | 11/2011 | Shah | ........................ C23C 4/06 438/110 |
| 8,399,964 B2 | 3/2013 | Katti | |
| 8,513,781 B2 * | 8/2013 | Yoo | ....................... H01L 23/552 257/659 |
| 9,461,001 B1 | 10/2016 | Tsai et al. | |
| 2002/0071940 A1 | 6/2002 | Arnold et al. | |
| 2012/0228749 A1 * | 9/2012 | Pagaila | .................. H01L 23/147 257/659 |
| 2014/0239464 A1 * | 8/2014 | Chung | .................... H01L 23/60 257/659 |
| 2015/0123251 A1 * | 5/2015 | Chiu | ..................... H01L 23/552 257/659 |
| 2016/0358862 A1 | 12/2016 | Lee et al. | |

OTHER PUBLICATIONS

Final Office Action for U.S. Appl. No. 14/990,366, dated Jun. 29, 2017, 16 pages.
Notice of Allowance for U.S. Appl. No. 14/990,366, dated Sep. 11, 2017, 8 pages.

* cited by examiner

| Item | Coating thickness (unit : um) | | | | | | | Total thickness (um) | SE meas. f=10MHz (dB) |
|---|---|---|---|---|---|---|---|---|---|
| | Seed layer | 1st layer | 2nd layer | 3rd layer | 4th layer | 5th layer | Protection layer | | |
| | SUS | Cu | NiFe | Cu | NiFe | Cu | SUS | | |
| 1 | 0.2 | 5 | 0.1 | | | | 0.1 | 5.4 | 15.83 |
| 2 | 0.2 | 10 | 0.1 | | | | 0.1 | 10.4 | 22.0 |
| 3 | 0.2 | 40 | 0.1 | | | | 0.1 | 40.4 | 34.8 |
| 4 | 0.2 | 5 | 0.1 | 5 | 0.1 | | 0.1 | 10.5 | 29.3 |
| 5 | 0.2 | 7 | 0.1 | 7 | 0.1 | | 0.1 | 14.5 | 33.9 |
| 6 | 0.2 | 10 | 0.1 | 10 | 0.1 | | 0.1 | 20.5 | 41.7 |
| 7 | 0.2 | 4 | 0.1 | 4 | 0.1 | 4 | 0.1 | 12.5 | 38.3 |
| 8 | 0.2 | 5 | 0.1 | 5 | 0.1 | 5 | 0.1 | 15.5 | 42.2 |
| 9 | 0.2 | 5 | 0.1 | 4 | 0.1 | 3 | 0.1 | 12.5 | 38.4 |
| 10 | 0.2 | 3 | 0.1 | 4 | 0.1 | 5 | 0.1 | 12.5 | 38.2 |

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 14/990,366, filed Jan. 7, 2016, the content of which is incorporated herein by reference in its entirety.

BACKGROUND

1. Technical Field

The present disclosure relates generally to semiconductor device packages and manufacturing methods thereof. More particularly, the present disclosure relates to semiconductor device packages with electromagnetic interference (EMI) shielding.

2. Description of the Related Art

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference (EMI). Smaller sized semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package by a metal casing or housing. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package. However, such metal casing or housing may not block electromagnetic emissions of relatively low frequency (e.g., under 1 gigahertz (GHz)). Further, such metal casing or housing can add to manufacturing and product costs.

It is against this background that a need arose to develop the semiconductor device packages and related methods described herein.

SUMMARY

In an aspect, a semiconductor device package includes: (1) a carrier; (2) an electronic component disposed over a top surface of the carrier; (3) a package body disposed over the top surface of the carrier and covering the electronic component; and (4) a shield layer, including a first magnetically permeable layer disposed over the package body, a first electrically conductive layer disposed over the first magnetically permeable layer, and a second magnetically permeable layer disposed over the first electrically conductive layer. The first electrically conductive layer is interposed between the first magnetically permeable layer and the second magnetically permeable layer. A permeability of the first electrically conductive layer is different from a permeability of the first magnetically permeable layer and a permeability of the second magnetically permeable layer.

In an aspect, a semiconductor device package includes: (1) a carrier; (2) an electronic component disposed over the carrier; (3) a package body encapsulating the electronic component and the carrier; and (4) a shield layer, including a first electrically conductive layer disposed over the package body, a first magnetically permeable layer disposed over the first electrically conductive layer, and a second electrically conductive layer disposed over the first magnetically permeable layer. The second electrically conductive layer directly contacts lateral surfaces of the first magnetically permeable layer, the first electrically conductive layer and the carrier.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figures 1A, 1B:
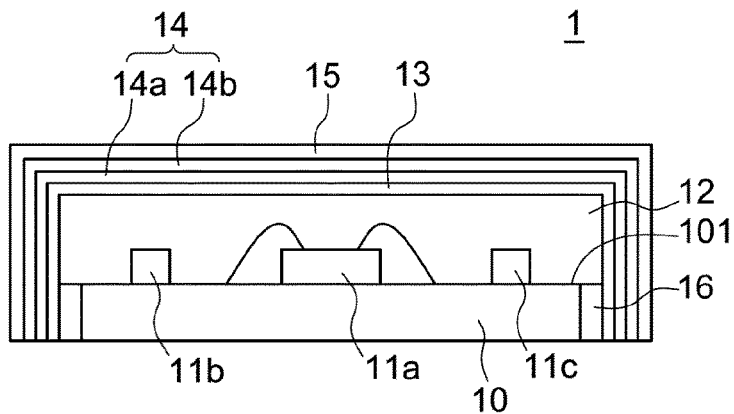
FIG. 1A illustrates a cross-sectional view of a semiconductor device package in accordance with an embodiment of the present disclosure.
FIG. 1B illustrates testing results in accordance with an embodiment of the present disclosure.

FIG. 1A illustrates a cross-sectional view of a semiconductor device package 1 in accordance with an embodiment of the present disclosure. The semiconductor device package 1 includes a substrate 10, electronic components 11a, 11b, 11c, a package body 12, a seed layer 13, an EMI shield 14, and a protection layer 15.

The substrate 10 is formed of, for example, a printed circuit board, such as a paper-based copper foil laminate, a composite copper foil laminate, or a polymer-impregnated glass-fiber-based copper foil laminate. The substrate 10 may include a redistribution layer (RDL) or traces; for example, for electrical connection between components (e.g., the electronic components 11a, 11b, 11c) mounted on a top surface 101 of the substrate 10. In one or more embodiments, the electronic components 11a, 11b, 11c are disposed on pads on the substrate 10. The substrate 10 can be replaced by other suitable carriers, such as a leadframe.

The electronic component 11a is disposed on the top surface 101 of the substrate 10. In one or more embodiments, the electronic component 11a is an active component, such as a chip or a semiconductor die. The electronic component 11a can be electrically connected to the substrate 10 by flip chip bonding, wire-bonding, or both.

The electronic components 11b, 11c are disposed on the top surface 101 of the substrate 10. In one or more embodiments, the electronic components 11b, 11c are surface mounted on the top surface 101 of the substrate 10. In one or more embodiments, the electronic components 11b, 11c are passive components, for example, resistors, capacitors, inductors, filters, diplexers, baluns, or a combination of such components.

The package body 12 is disposed on the top surface 101 of the substrate 10 to encapsulate the electronic components 11a, 11b, 11c. The package body 12 can be, or can include, for example, an epoxy resin having fillers, a molding compound (e.g., an epoxy molding compound or other molding compound), a polyimide, a phenolic compound or material, a material with a silicone dispersed therein, or a combination thereof.

The seed layer 13 is disposed on the package body 12 to cover a top surface of the package body 12, and also to cover lateral surfaces of the package body 12 and lateral surfaces of the substrate 10 that are substantially coplanar with respective lateral surfaces of the package body 12. The seed layer 13 is formed of, for example, copper (Cu), tin (Sn), stainless steel, another metal or metal alloy, or a combination thereof.

The EMI shield 14 is disposed on the seed layer 13 and covers a top surface and lateral surfaces of the seed layer 13. The seed layer 13 is disposed between the package body 12 and the EMI shield 14 to strengthen the adhesion between the package body 12 and the EMI shield 14.

As shown in FIG. 1A, the EMI shield 14 includes an electrically conductive layer 14a and a magnetically permeable layer 14b. The conductive layer 14a is disposed on the seed layer 13. The electrically conductive layer 14a is, or includes, a material with a high conductivity and a high magnetic saturation. For example, the electrically conductive layer 14a is silver (Ag), Cu, aluminum (Al), gold (Au), or an alloy thereof. One measure of electrical conductivity is in terms of Siemens per meter (S/m). Examples of suitable electrically conductive materials for the electrically conductive layer 14a include those having a conductivity greater than about $10^4$ S/m, such as at least about $10^5$ S/m, at least about $10^6$ S/m, at least about $3\times10^6$ S/m, at least about $4\times10^6$ S/m, at least about $5\times10^6$ S/m, or at least about $6\times10^6$ S/m. Electrical conductivity of a material can be measured at room temperature.

The magnetically permeable layer 14b is disposed on the electrically conductive layer 14a. The magnetically permeable layer 14b is, or includes, a material with a high permeability and a low magnetic saturation. The magnetically permeable layer 14b can be, or can include, for example, molybdenum (Mo), nickel (Ni), cobalt (Co), iron (Fe), iron-cobalt alloy (FeCo), iron-nickel alloy (FeNi or NiFe), nickel-vanadium alloy (NiV) or an alloy thereof, another magnetically permeable metal or metal alloy (e.g., another nickel-containing or iron-containing material), or a combination thereof. One measure of magnetic permeability of a material is in terms of its relative permeability with respect to a permeability of free space. Examples of suitable magnetically permeable materials for the magnetically permeable layer 14b include those having a relative permeability greater than about 1, such as at least about 2, at least about 5, at least about 10, at least about 50, at least about 100, at least about 500, at least about 1000, at least about 5000, at least about $10^4$, at least about $10^5$, or at least about $10^6$. Magnetic permeability of a material can be measured at room temperature and at a particular field strength, such as 0.5 Tesla or 0.002 Tesla. In one or more embodiments, the permeability of the magnetically permeable layer 14b is in a range from about 500 Henries/meter (H/m) to about 3000 H/m.

In one or more embodiments, a ratio of a thickness of the electrically conductive layer 14a to a thickness of the magnetically permeable layer 14b is in a range of about 30:1 to about 400:1. In one or more embodiments, a ratio of the thickness of the electrically conductive layer 14a to the thickness of the magnetically permeable layer 14b is in a range of about 40:1 to about 100:1. In one or more embodiments, a ratio of the thickness of the electrically conductive layer 14a to the thickness of the magnetically permeable layer 14b is in a range of about 50:1 to about 70:1. In one or more embodiments, a ratio of the thickness of the electrically conductive layer 14a to the thickness of the magnetically permeable layer 14b is greater than about 1:1, such as about 30:1 or greater, about 40:1 or greater, or about 50:1 or greater. The ratio may change based on the use of different materials.

In one or more embodiments, the thickness of the electrically conductive layer 14a is about 3 μm. In one or more embodiments, the thickness of the electrically conductive layer 14a is about 4 μm. In one or more embodiments, the thickness of the electrically conductive layer 14a is about 5 μm. In one or more embodiments, the thickness of the electrically conductive layer 14a is about 7 μm. In one or more embodiments, the thickness of the electrically conductive layer 14a is about 10 μm. In one or more embodiments, the thickness of the electrically conductive layer 14a is about 40 μm.

In one or more embodiments, the thickness of the magnetically permeable layer 14b is in a range from about 0.09 μm to about 0.11 μm. In one or more embodiments, the thickness of the magnetically permeable layer 14b is about 0.1 μm.

In one or more embodiments, the EMI shield 14 includes multiple electrically conductive layers 14a and/or multiple magnetically permeable layers 14b. In such embodiments, the electrically conductive layers 14a may be interspersed with the magnetically permeable layer 14b. In one or more embodiments including multiple electrically conductive layers 14a, each electrically conductive layer 14a has substantially the same thickness. In other embodiments, one or more of the multiple electrically conductive layers 14a has a different thickness than one or more others of the multiple electrically conductive layers 14a. In one or more embodiments including multiple magnetically permeable layers 14b, each magnetically permeable layer 14b has substantially the same thickness. In other embodiments, one or more of the multiple magnetically permeable layers 14b has a different thickness than one or more others of the multiple magnetically permeable layers 14b. In one or more embodiments, a sum of thicknesses of the multiple electrically conductive layers 14a and the multiple magnetically permeable layers 14b (e.g., a thickness of the EMI shield 14) is about 10.5 micrometers (μm). In one or more embodiments, the sum of thicknesses is about 12.5 μm. In one or more embodiments, the sum of thicknesses is about 14.5 μm. In one or more embodiments, the sum of thicknesses is about 15.5 μm. In one or more embodiments, the sum of thicknesses is about 20.5 μm.

The protection layer 15 is disposed on the EMI shield 14 and covers a top surface and lateral surfaces of the EMI shield 14. The protection layer 15 serves to protect the EMI shield 14 from rusting, and the EMI shielding effect is further enhanced by the protection layer 15. In one or more embodiments, the protection layer 15 is formed of, for example, stainless steel, epoxy, NiV, or a combination thereof.

Vias 16 are disposed adjacent to a periphery of the substrate 10. More particularly, the vias 16 are disposed adjacent to the lateral surfaces of the substrate 10. In one or more embodiments, the vias 16 may be grounding segments. The vias 16 are electrically connected to at least some of traces or other electrical interconnects included in the substrate 10 and provide electrical pathways to reduce EMI. In one or more embodiments, a height of the vias 16 is substantially the same as a thickness of the substrate 10; namely, a difference between the height of the vias 16 and the thickness of the substrate 10 is less than or equal to ±10% of the thickness of the substrate 10, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. In one or more embodiments, the vias 16 are formed from a metal, a metal alloy, or another suitable electrically conductive material.

FIG. 1B provides performance test results, illustrating EMI shielding performance for various embodiments of the EMI shield 14. In the embodiments tested, the seed layer 13 was stainless steel (SUS), the electrically conductive layer(s) 14a were Cu, the magnetically permeable layer(s) 14b were a nickel-iron (NiFe) alloy, and the protection layer 15 was SUS. In FIG. 1B, the second column shows a thickness in μm of the seed layer 13 for the various embodiments; the third, fifth and seventh columns show a thickness in μm of the electrically conductive layer(s) 14a in the various embodiments (as applicable); the fourth and the sixth columns show a thickness in μm of the magnetically permeable layer(s) 14b in the various embodiments (as applicable); the eighth column shows a thickness in μm of the protection layer 15 in the various embodiments; the ninth column shows a combined (total) thickness in μm of the seed layer 13, the electrically conductive layer(s) 14a, the magnetically permeable layer(s) 14b and the protection layer 15; and the tenth column shows the measurement results of the shielding effectiveness at 10 megahertz (MHz).

As seen in FIG. 1B (items 1, 2, 3), for a single electrically conductive layer 14a of Cu and a single magnetically permeable layer 14b of NiFe, as the thickness of the electrically conductive layer 14a is increased from about 5 μm to about 10 μm to about 40 μm, the shielding effectiveness increases. As also seen in FIG. 1B (items 4, 5, 6), for two electrically conductive layers 14a of Cu interspersed with two magnetically permeable layers 14b of NiFe, as the thickness of each electrically conductive layer 14a is increased from about 5 μm to about 7 μm to about 10 μm, the shielding effectiveness increases. As further seen in FIG. 1B, for three electrically conductive layers 14a of Cu interspersed with three magnetically permeable layers 14b of NiFe, as the thickness of each electrically conductive layer 14a is increased from about 4 μm to about 5 μm (items 7, 8), the shielding effectiveness increases; and the total thickness has more impact on the shielding effectiveness than does a variation of thickness between the electrically conductive layers 14a (items 9, 10, as compared to items 7, 8).

Because the EMI shield 14 includes two types of layers, namely the electrically conductive layer(s) 14a and the magnetically permeable layer(s) 14b, the EMI shield 14 can have characteristics of both high conductivity and high permeability. In addition, the electrically conductive layer(s) 14a and the magnetically preamble layer(s) 14b can be layered in an interspersed manner (e.g., such that an electrically conductive layer 14a would not directly contact another electrically conductive layer 14a, or such as a magnetically preamble layer 14b would not directly contact another magnetically preamble layer 14b), which can increase the EMI shielding performance (compare, for example, items 2 and 4, items 3 and 7, and items 6 and 8 in FIG. 1B). For example, to achieve a same EMI shielding performance, the EMI shield 14 with multiple interspersed layers as described is thinner than with a single shielding layer. Therefore, in accordance with the present disclosure, the cost for manufacturing the semiconductor device package 1 can be reduced by reducing the total thickness of the EMI shield 14 through use of the multiple layers.

Therefore, in comparison with using a single shielding layer, the multi-layer EMI shield 14 as described in the present disclosure can provide improved EMI shielding performance. Further, as shown by the tests of FIG. 1B at 10 MHz, EMI shielding performance is improved by the EMI shield 14 for components 11a, 11b and 11c of the semiconductor device package 1 operating at a relatively low frequency (10 MHz).

Figure 2:
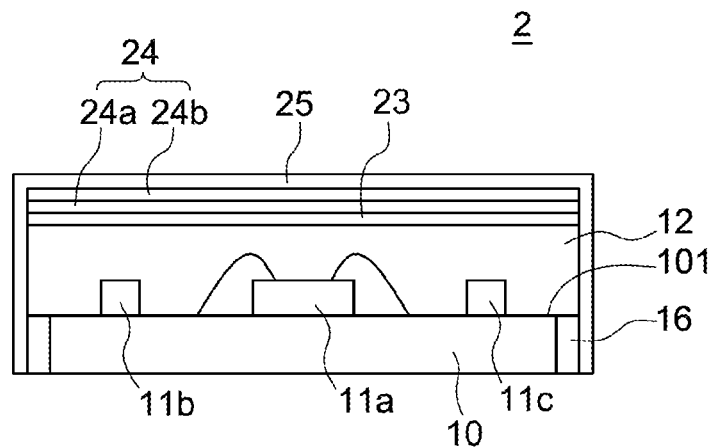
FIG. 2 illustrates a cross-sectional view of a semiconductor device package in accordance with an embodiment of the present disclosure.

FIG. 2 illustrates a cross-sectional view of a semiconductor device package 2 in accordance with an embodiment of the present disclosure. The semiconductor device package 2 in FIG. 2 is similar to the semiconductor device package 1 in FIG. 1A, except that a coverage of a seed layer 23, an EMI shield 24 and a protection layer 25 in FIG. 2 is different from the coverage of the corresponding seed layer 13, EMI shield 14 and protection layer 15 in FIG. 1A.

As shown in FIG. 2, the seed layer 23 is disposed on the package body 12 and covers the top surface of the package body 12. Lateral surfaces of the seed layer 23, lateral surfaces of the substrate 10, and lateral surfaces of the package body 12 are substantially coplanar. The EMI shield 24 is disposed on the seed layer 23 to cover a top surface of the seed layer 23. Lateral surfaces of the EMI shield 24 and respective lateral surfaces of the seed layer 23 are substantially coplanar. The protection layer 25 is disposed on the EMI shield 24 to cover a top surface of the EMI shield 24 and the substantially coplanar lateral surfaces of the substrate 10, the package body 12, the seed layer 23 and the EMI shield 24.

Figure 3A:
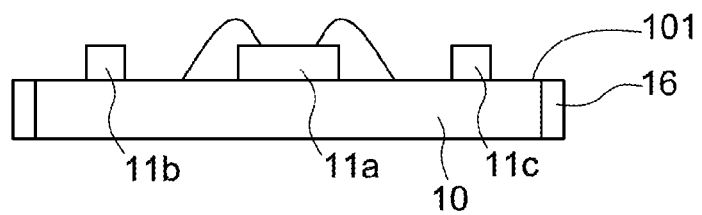
FIG. 3A, FIG. 3B and FIG. 3C illustrate a manufacturing process in accordance with an embodiment of the present disclosure.
Figure 3B:
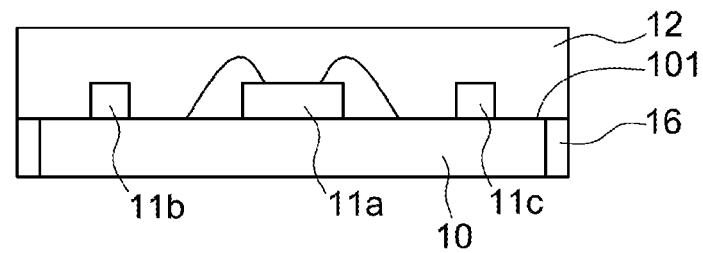
Figure 3C:
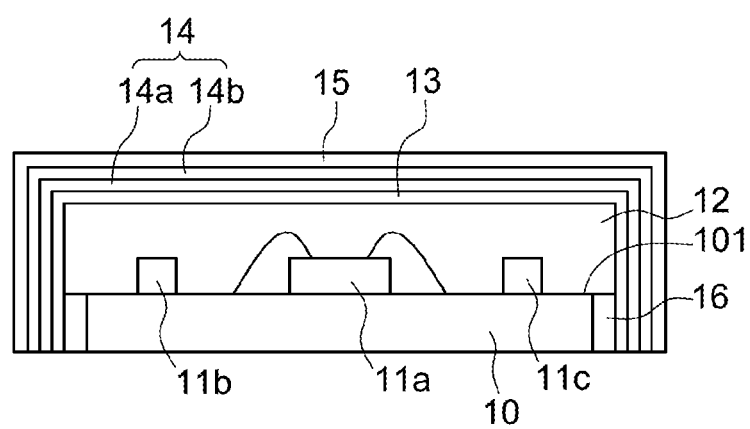

FIGS. 3A-3C illustrate a semiconductor manufacturing process in accordance with an embodiment of the present disclosure.

Referring to FIG. 3A, a substrate 10 is provided. The substrate 10 is, for example, a printed circuit board, such as a paper-based copper foil laminate, a composite copper foil laminate, or a polymer-impregnated glass-fiber-based copper foil laminate. The substrate 10 can include a redistribution layer (RDL) or traces for electrical connection between components mounted on a top surface 101 of the substrate 10. The substrate 10 can be replaced by other suitable carriers, such as a leadframe.

Electronic components 11a, 11b, 11c are placed on the top surface 101 of the substrate 10. In one or more embodiments, the electronic component 11a is an active component, such as a chip or a semiconductor die. The electronic component 11a can be electrically connected to the substrate 10 by flip chip bonding, wire-bonding, or both. The electronic components 11b, 11c are surface mounted on the top surface 101 of the substrate 10. In one or more embodiments, the electronic components 11b, 11c are passive components, for example, resistors, capacitors, inductors, filters, diplexers, baluns, or a combination of such components.

Vias 16 are formed in the substrate 10. The vias 16 are connected to electrical interconnects included in the substrate 10 and provide electrical pathways to reduce EMI.

In one or more embodiments, the vias 16 can be formed by: (i) forming openings by, for example, photolithography, chemical etching, laser drilling, or mechanical drilling; and (ii) plating the openings by using, for example, a metal, a metal alloy, a matrix with a metal or a metal alloy dispersed therein, or another suitable electrically conductive material.

Referring to FIG. 3B, a package body 12 is formed to substantially cover or encapsulate the electronic components 11a, 11b, 11c. For example, the package body 12 can be formed by applying an encapsulant to the top surface 101 of the substrate 10. The encapsulant may include a Novolac-based resin, an epoxy-based resin, a silicone-based resin, or another suitable material. The encapsulant can be applied using any of a number of molding techniques, such as compression molding, injection molding, or transfer molding. In one or more embodiments, the substrate 10 is one of a series of substrates 10 joined together, and subsequent to forming the package body 12, the series of substrates 10 is singulated to form individual devices, which are then processed through subsequent stages.

Referring to FIG. 3C, a seed layer 13 is formed adjacent to exposed surfaces, including exterior surfaces of the package body 12, lateral surfaces of the vias 16 exposed by the package body 12, and lateral surfaces of the substrate 10. The seed layer 13 can be formed, for example, by physical vapor deposition (PVD), chemical vapor deposition (CVD), electroless plating, electroplating, sputtering or spraying. The seed layer 13 may be, or may include, for example, Cu, Sn, stainless steel, another metal or metal alloy, or a combination thereof.

An electrically conductive layer 14a is formed on the seed layer 13 to cover a top surface and lateral surfaces of the seed layer 13. The electrically conductive layer 14a can be formed, for example, by PVD, CVD, electroless plating, electroplating, sputtering or spraying. The electrically conductive layer 14a is, or includes, a material with a high conductivity and high magnetic saturation. For example, the electrically conductive layer 14a may be, or may include, for example, Ag, Cu, Al, Au, or an alloy thereof.

A magnetically permeable layer 14b is formed on the electrically conductive layer 14a to cover a top surface and lateral surfaces of the electrically conductive layer 14a. The electrically conductive layer 14b can be formed, for example, by PVD, CVD, electroless plating, electroplating, sputtering or spraying. The magnetically permeable layer 14b is, or includes, a material with a high permeability and low magnetic saturation. The magnetically permeable layer 14b may be, or may include, for example, Mo, Ni, Co, Fe, FeCo, FeNi (or NiFe), NiV or an alloy thereof, another magnetically permeable metal or metal alloy (e.g., another nickel-containing or iron-containing material), or a combination thereof.

A protection layer 15 is formed on the magnetically permeable layer 14b to cover a top surface and lateral surfaces of the magnetically permeable layer 14b. The protection layer 15 can be formed, for example, by PVD, CVD, electroless plating, electroplating, sputtering or spraying. The protection layer 15 may be, or may include, for example, stainless steel, epoxy, NiV, or a combination thereof.

In one or more embodiments, the EMI shield 14 includes multiple electrically conductive layers 14a and/or multiple magnetically permeable layers 14b. In such embodiments, the electrically conductive layers 14a may be interspersed with the magnetically permeable layer 14b. Different layers of the EMI shield 14 can be formed using a same or similar coating technique, or different coating techniques. In one or more embodiments including multiple electrically conductive layers 14a, each electrically conductive layer 14a has substantially the same thickness. In other embodiments, one or more of the multiple electrically conductive layers 14a has a different thickness than one or more others of the multiple electrically conductive layers 14a. In one or more embodiments including multiple magnetically permeable layers 14b, each magnetically permeable layer 14b has substantially the same thickness. In other embodiments, one or more of the multiple magnetically permeable layers 14b has a different thickness than one or more others of the multiple magnetically permeable layers 14b.

In one or more embodiments, during the formation of the EMI shield 14, a magnetic dipole rearrangement technique can be performed so that a magnetically permeable moment of the magnetically permeable layer 14b is rearranged, by applying an appropriate magnetic field over area on which the EMI shield 14 is to be formed, to maintain the magnetically permeable layer 14b of the EMI shield 14 at a high relative permeability. For example, a magnetic field of about 100 to about 1000 Oersted (Oe) can be applied during the formation of the magnetically permeable layer 14b, so that the permeability of the magnetically permeable layer 14b would be in a range from about 500 H/m to about 3000 H/m. In one or more embodiments, annealing at about 100 to about 1000 Celsius can be applied to the EMI shield 14 to maintain the magnetically permeable layer 14b of the EMI shield 14 at high relative permeability (from about 500 H/m to about 3000 H/m). Due to the high permeability of the magnetically permeable layer 14b of the EMI shield 14, the semiconductor device packages of the present disclosure have improved EMI shielding performance.

In one or more embodiments, the substrate 10 is one of a series of substrates 10 joined together, and subsequent to the stage of FIG. 3C, the series of substrates 10 is singulated to form individual devices.

FIGS. 4A-4D illustrate a semiconductor manufacturing process in accordance with an embodiment of the present disclosure.

Figure 4A:
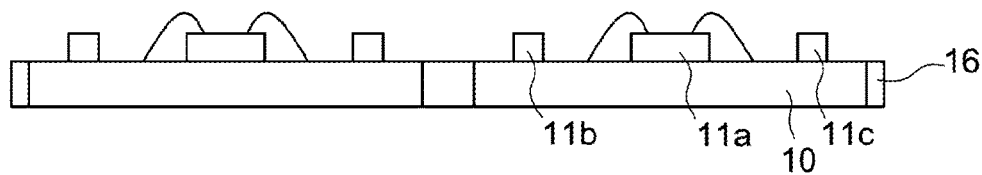
FIG. 4A, FIG. 4B, FIG. 4C, FIG. 4D and FIG. 4E illustrate a manufacturing process in accordance with an embodiment of the present disclosure.

Referring to FIG. 4A, a series of substrates 10 are provided. Each substrate 10 is, for example, a printed circuit board, such as a paper-based copper foil laminate, a composite copper foil laminate, or a polymer-impregnated glass-fiber-based copper foil laminate. Each substrate 10 can include a redistribution layer (RDL) or traces for electrical connection between components mounted on a top surface 101 of the substrate 10. The substrate 10 can be replaced by other suitable carriers, such as leadframes.

Electronic components 11a, 11b, 11c are placed on the top surface 101 of each substrate 10. In one or more embodiments, the electronic component 11a is an active component, such as a chip or a semiconductor die. The electronic component 11a can be electrically connected to the substrate 10 by flip chip bonding, wire-bonding, or both. The electronic components 11b, 11c are surface mounted on the top surface 101 of the substrate 10. In one or more embodiments, the electronic components 11b, 11c are passive components, for example, resistors, capacitors, inductors, filters, diplexers, baluns, or a combination of such components.

Vias 16 are formed in each substrate 10. The vias 16 are connected to electrical interconnects included in the substrate 10 and provide electrical pathways to reduce EMI.

In one or more embodiments, the vias 16 can be formed by (i) forming openings by, for example, photolithography, chemical etching, laser drilling, or mechanical drilling; and (ii) plating the openings by using, for example, a metal, a metal alloy, a matrix with a metal or a metal alloy dispersed therein, or another suitable electrically conductive material.

Figure 4B:
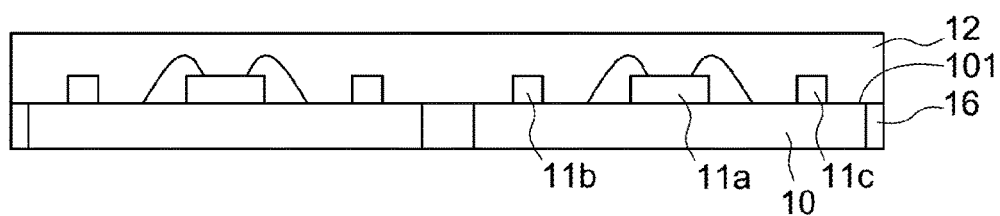

Referring to FIG. 4B, a package body 12 is formed to substantially cover or encapsulate the electronic components 11a, 11b, 11c. For example, the package body 12 can be formed by applying an encapsulant to the top surface 101 of the substrate 10. The encapsulant may be, for example, a Novolac-based resin, an epoxy-based resin, a silicone-based resin, or another suitable material. The encapsulant may be applied using any of a number of molding techniques, such as compression molding, injection molding, or transfer molding.

Figure 4C:
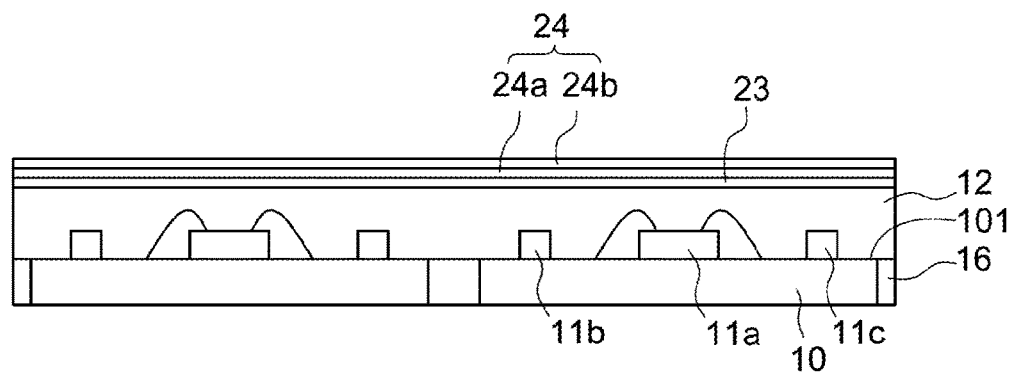

Referring to FIG. 4C, a seed layer 23 is formed on a top surface of the package body 12. The seed layer 23 can be formed, for example, by PVD, CVD, electroless plating, electroplating, spraying or sputtering. The seed layer 23 may be, or may include, for example, Cu, Sn, stainless steel, another metal or metal alloy, or a combination thereof.

A electrically conductive layer 24a is formed on the seed layer 23. The electrically conductive layer 24a can be formed by, for example, PVD, CVD, electroless plating, electroplating or spraying. The electrically conductive layer 24a may be, or may include, a material with a high conductivity and high magnetic saturation. For example, the electrically conductive layer 24a may be Ag, Cu, Al, Au, or an alloy thereof.

A magnetically permeable layer 24b is formed on the electrically conductive layer 14a. The electrically conductive layer 24b can be formed, for example, by PVD, CVD, electroless plating, electroplating, spraying or sputtering. The magnetically permeable layer 24b may be, or may include, a material with a high permeability and low magnetic saturation. The magnetically permeable layer 24b may be, or may include, for example, Mo, Ni, Co, Fe, FeCo, FeNi (or NiFe), NiV or an alloy thereof, another magnetically permeable metal or metal alloy (e.g., another nickel-containing or iron-containing material), or a combination thereof.

In one or more embodiments, the EMI shield 24 includes multiple electrically conductive layers 24a and/or multiple magnetically permeable layers 24b. In such embodiments, the electrically conductive layers 24a may be interspersed with the magnetically permeable layer 24b. Different layers of the EMI shield 24 can be formed using a same or similar coating technique, or different coating techniques. In one or more embodiments including multiple electrically conductive layers 24a, each electrically conductive layer 24a has substantially the same thickness. In other embodiments, one or more of the multiple electrically conductive layers 24a has a different thickness than one or more others of the multiple electrically conductive layers 24a. In one or more embodiments including multiple magnetically permeable layers 24b, each magnetically permeable layer 24b has substantially the same thickness. In other embodiments, one or more of the multiple magnetically permeable layers 24b has a different thickness than one or more others of the multiple magnetically permeable layers 24b.

In one or more embodiments, during the formation of the EMI shield 24, a magnetic dipole rearrangement technique can be performed so that a magnetically permeable moment of the magnetically permeable layer 14b is rearranged, by applying an appropriate magnetic field over area on which the EMI shield 24 is to be formed, to maintain the magnetically permeable layer 24b of the EMI shield 24 at a high relative permeability. For example, a magnetic field of about 100 to about 1000 Oe can be applied during the formation of the magnetically permeable layer 24b, so that the permeability of the magnetically permeable layer 24b would be in a range from about 500 H/m to about 3000 H/m. In one or more embodiments, annealing at about 100 to about 1000 Celsius can be applied to the EMI shield 24 to maintain the magnetically permeable layer 24b of the EMI shield 24 at high relative permeability (from about 500 H/m to about 3000 H/m). Due to the high permeability of the magnetically permeable layer 24b of the EMI shield 24, the semiconductor device packages of the present disclosure have improved EMI shielding performance.

As shown in FIG. 4C, lateral surfaces of the EMI shield 24 (e.g., lateral surfaces of the electrically conductive layer(s) 24a and lateral surfaces of the magnetically permeable layer(s) 24b), lateral surfaces of the seed layer 23, lateral surfaces of the package body 12, and lateral surfaces of the substrate 10 are substantially coplanar.

Figure 4D:
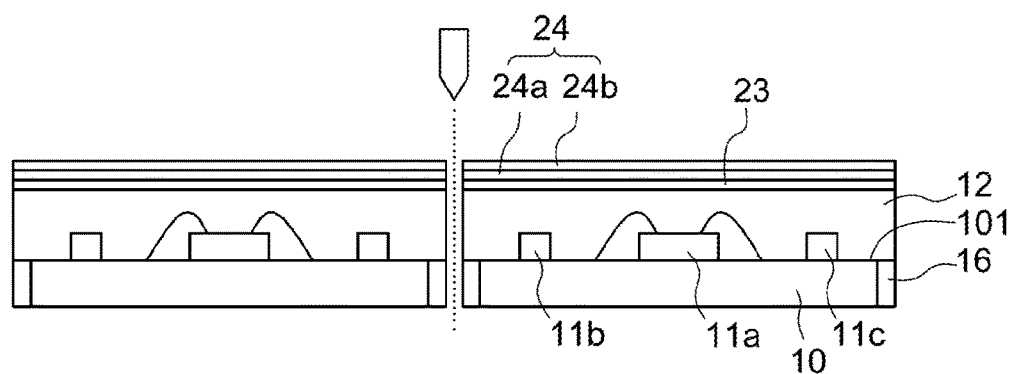

Referring to FIG. 4D, a singulation technique is performed to separate the series of substrates 10 into multiple individual substrates 10. The singulation technique may be performed by laser cutting, sawing or other suitable technique.

Figure 4E:
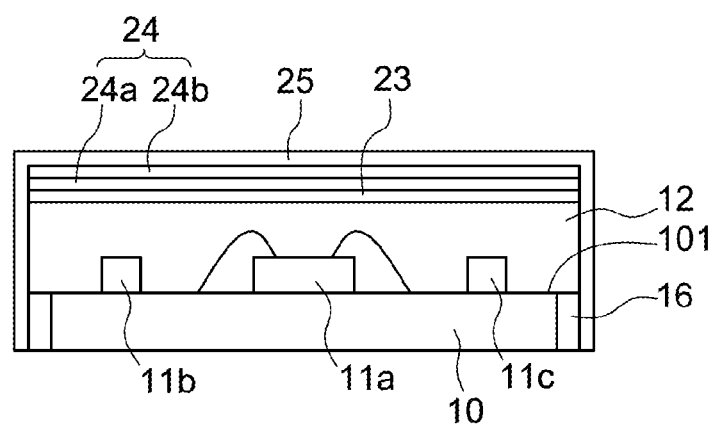

Referring to FIG. 4E, a protection layer 25 is formed on the magnetically permeable layer 24b to cover a top surface of the magnetically permeable layer 24b and the substantially coplanar lateral surfaces of the EMI shield 24, the seed layer 23, the package body 12 and the substrate 10. The protection layer 25 may be formed, for example, by PVD, CVD, electroless plating, electroplating, sputtering or spraying. The protection layer 25 may be, or may include, for example, stainless steel, epoxy, NiV, or a combination thereof.

For the embodiments described above in which the EMI shield (e.g., EMI shield 14 or 24) includes multiple electrically conductive layers (e.g., electrically conductive layers 14a or 24a) and/or multiple magnetically permeable layers (e.g., magnetically permeable layers 14b or 24b), a number of electrically conductive layers may be different than a number of magnetically permeable layers. Accordingly, the number of electrically conductive layers may be less than, equal to, or greater than the number of magnetically permeable layers. For example, the number of electrically conductive layers may be n, and the number of magnetically permeable layers may be n−1.

As used herein, the terms "substantially" and "about" are used to describe and account for small variations. For example, when used in conjunction with a numerical value, the terms can encompass a range of variation of less than or equal to ±10% of that value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, two values which are "substantially the same" can encompass a difference between the two values that is less than or equal to ±10% of one of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. For another example, a material can be deemed to "substantially cover" a surface if the material covers greater than 95% of the surface; and a material can be deemed to "substantially cover" a component if more than 95% of each surface of the component exposed to the material is covered by the material.

Additionally, amounts, ratios, and other numerical values are sometimes presented herein in a range format. It can be understood that such range formats are used for convenience and brevity, and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a carrier;
    an electronic component disposed over a top surface of the carrier;
    a package body disposed over the top surface of the carrier and covering the electronic component; and
    a shield layer, comprising a first magnetically permeable layer disposed over the package body, a first electrically conductive layer disposed over the first magnetically permeable layer, and a second magnetically permeable layer disposed over the first electrically conductive layer,
    wherein the first electrically conductive layer is interposed between the first magnetically permeable layer and the second magnetically permeable layer,
    wherein a permeability of the first electrically conductive layer is lower than each of a permeability of the first magnetically permeable layer and a permeability of the second magnetically permeable layer.

2. The semiconductor device package according to claim 1, wherein a thickness of the first magnetically permeable layer and a thickness of the second magnetically permeable layer each ranges from about 0.09 μm to about 0.11 μm.

3. The semiconductor device package according to claim 1, wherein the shield layer further comprises a second electrically conductive layer disposed over the second magnetically permeable layer.

4. The semiconductor device package according to claim 3, further comprising a protection layer covering a top surface of the second electrically conductive layer and lateral surfaces of the shield layer, the package body and the carrier.

5. The semiconductor device package according to claim 3, wherein a thickness of the first electrically conductive layer is greater than or equal to a thickness of the second electrically conductive layer.

6. The semiconductor device package according to claim 5, wherein a thickness of the first magnetically permeable layer is substantially the same as a thickness of the second magnetically permeable layer.

7. The semiconductor device package according to claim 1, wherein the shield layer further comprises a second electrically conductive layer between the first magnetically permeable layer and the package body.

8. The semiconductor device package according to claim 7, further comprising a seed layer between the package body and the second electrically conductive layer.

9. The semiconductor device package according to claim 7, wherein a ratio of a thickness of the second electrically conductive layer to a thickness of the first magnetically permeable layer is in a range from about 30:1 to about 400:1.

10. The semiconductor device package according to claim 9, wherein the thickness of the second electrically conductive layer is greater than or equal to a thickness of the first electrically conductive layer.

11. The semiconductor device package according to claim 1, wherein a ratio of a thickness of the first electrically conductive layer to a thickness of the first magnetically permeable layer is in a range from about 40:1 to about 100:1.

12. A semiconductor device package, comprising:
    a carrier;
    an electronic component disposed over the carrier;
    a package body encapsulating the electronic component and the carrier; and
    a shield layer, comprising
        a first electrically conductive layer disposed over the package body;
        a first magnetically permeable layer disposed over the first electrically conductive layer;
        a second electrically conductive layer disposed over the first magnetically permeable layer; and
        a second magnetically permeable layer,
    wherein the second electrically conductive layer directly contacts lateral surfaces of the first magnetically permeable layer, the first electrically conductive layer and the carrier, and
    a permeability of the first electrically conductive layer is lower than each of a permeability of the first magnetically permeable layer and a permeability of the second magnetically permeable layer.

13. The semiconductor device package according to claim 12, wherein a thickness of the first magnetically permeable layer ranges from about 0.09 μm to about 0.11 μm.

14. The semiconductor device package according to claim 12, wherein the lateral surface of the first electrically conductive layer is substantially coplanar with a lateral surface of the package body.

15. The semiconductor device package according to claim 12, further comprising a seed layer between the package body and the first electrically conductive layer.

16. The semiconductor device package according to claim 15, wherein a lateral surface of the seed layer is substantially coplanar with a lateral surface of the package body.

17. The semiconductor device package according to claim 12, wherein a ratio of a thickness of the first electrically conductive layer to a thickness of the first magnetically permeable layer ranges from about 30:1 to about 400:1.

18. The semiconductor device package according to claim 12, wherein:
   the shield layer further comprises a third electrically conductive layer between the second electrically conductive layer and the first magnetically permeable layer, and
   the second magnetically permeable layer is disposed between the third electrically conductive layer and the second electrically conductive layer.

19. The semiconductor device package according to claim 18, wherein the shield layer further comprises a fourth electrically conductive layer between the second electrically conductive layer and the second magnetically permeable layer.

\* \* \* \* \*